United States Patent
Kishi

(10) Patent No.: US 9,818,523 B2
(45) Date of Patent: Nov. 14, 2017

(54) ELECTROMAGNET, TESTER AND METHOD OF MANUFACTURING MAGNETIC MEMORY

(71) Applicant: TOSHIBA MEMORY CORPORATION, Minato-ku, Tokyo (JP)

(72) Inventor: Tatsuya Kishi, Seongnam-si (KR)

(73) Assignee: TOSHIBA MEMORY CORPORATION, Tokyo (JP)

(*) Notice: Subject to any disclaimer, the term of this patent is extended or adjusted under 35 U.S.C. 154(b) by 0 days.

(21) Appl. No.: 14/593,646

(22) Filed: Jan. 9, 2015

(65) Prior Publication Data

US 2016/0055951 A1 Feb. 25, 2016

Related U.S. Application Data

(60) Provisional application No. 62/039,098, filed on Aug. 19, 2014.

(51) Int. Cl.
- *H01F 7/20* (2006.01)
- *G11C 29/08* (2006.01)
- *G11C 29/56* (2006.01)
- *G11C 29/50* (2006.01)
- *G11C 11/16* (2006.01)

(52) U.S. Cl.
CPC .............. *H01F 7/20* (2013.01); *G11C 29/50* (2013.01); *G11C 29/50016* (2013.01); *G11C 29/56* (2013.01); *G11C 29/56016* (2013.01); *G11C 11/16* (2013.01); *G11C 2029/5002* (2013.01)

(58) Field of Classification Search
None
See application file for complete search history.

(56) References Cited

U.S. PATENT DOCUMENTS

| | | | | |
|---|---|---|---|---|
| 2,775,742 A * | 12/1956 | Bogue | ........................ | H01F 5/04 336/136 |
| 2,957,966 A * | 10/1960 | Bennett | ................ | H01H 51/086 335/123 |
| 3,409,852 A * | 11/1968 | Uhlmann | ................ | G21K 1/093 335/216 |
| 3,555,419 A * | 1/1971 | Balckwell | ................ | G08B 5/24 324/146 |
| 4,547,757 A * | 10/1985 | Yamada | .................. | F16D 27/10 192/84.96 |
| 5,907,268 A * | 5/1999 | Mader | .................. | H01H 50/042 335/130 |
| 7,759,936 B2 * | 7/2010 | Iwadate | ........... | G01R 33/34007 324/318 |
| 8,482,370 B2 * | 7/2013 | Zurke | ........................ | H01F 5/04 335/217 |
| 2016/0372212 A1 * | 12/2016 | Kishi | ..................... | G11C 29/44 |

FOREIGN PATENT DOCUMENTS

| JP | 10154316 A | 6/1998 |
|---|---|---|
| JP | 2007127582 A | 5/2007 |
| JP | 2010157292 A | 7/2010 |

\* cited by examiner

*Primary Examiner* — Jermele M Hollington
(74) *Attorney, Agent, or Firm* — Holtz, Holtz & Volek PC

(57) ABSTRACT

According to one embodiment, an electromagnet includes a first electromagnet coil having a first portion and a second portion. The first portion of the first electromagnet coil extends in a direction in parallel with a first plane. The second portion of the first electromagnet coil extends in a direction in parallel with a second plane. The first and second planes intersect at a predetermined angle.

16 Claims, 16 Drawing Sheets

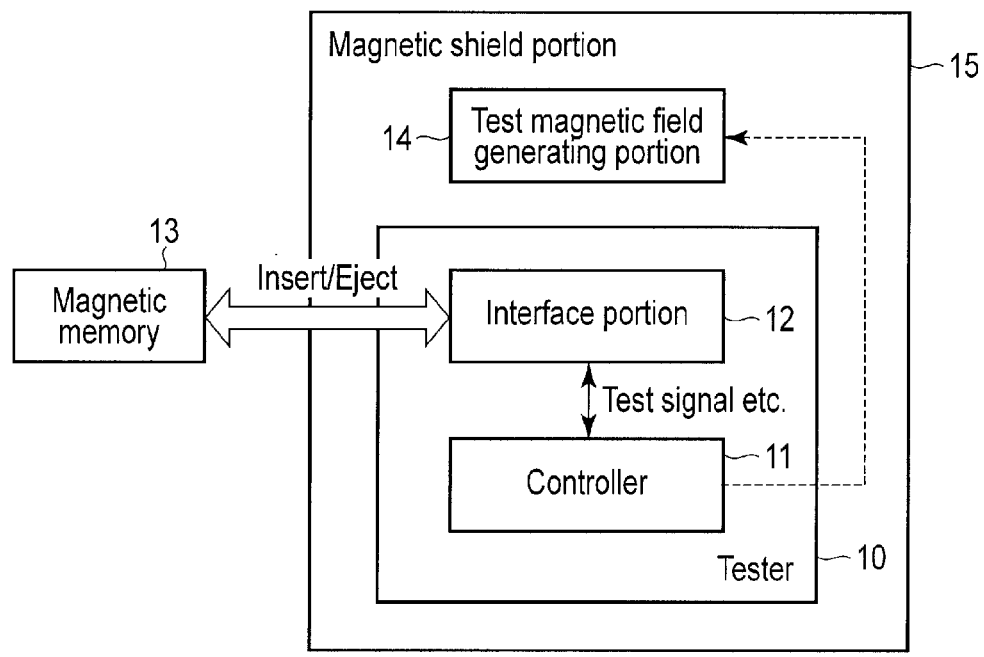
F I G. 1
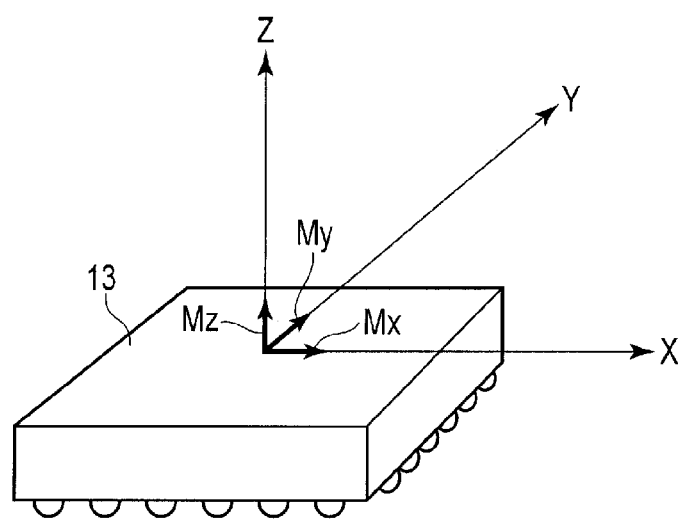
F I G. 2

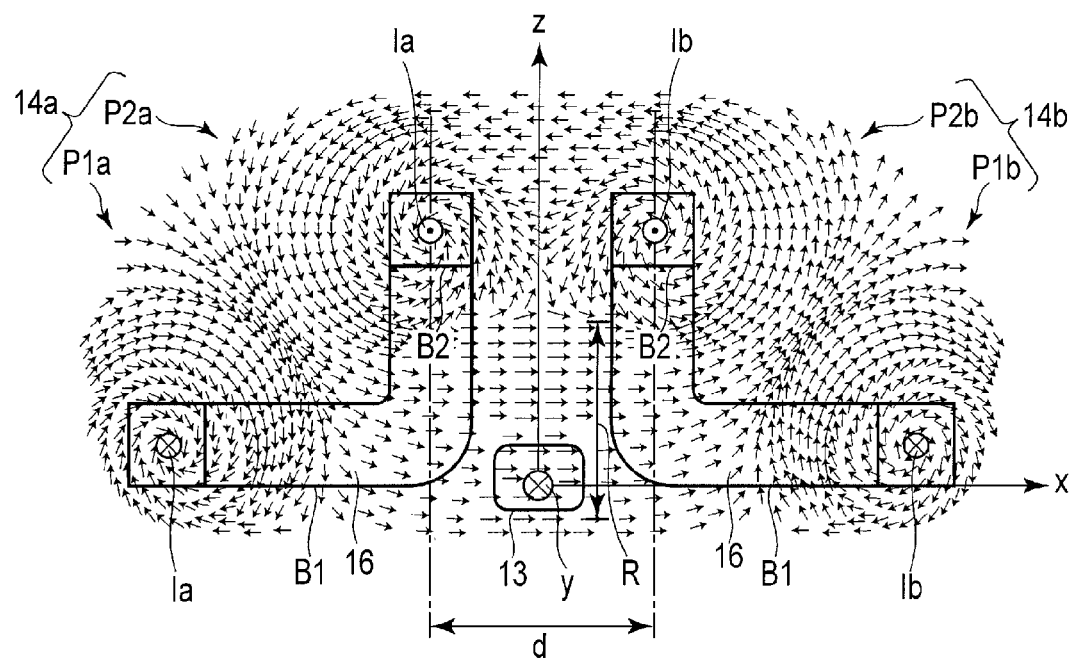
F I G. 7

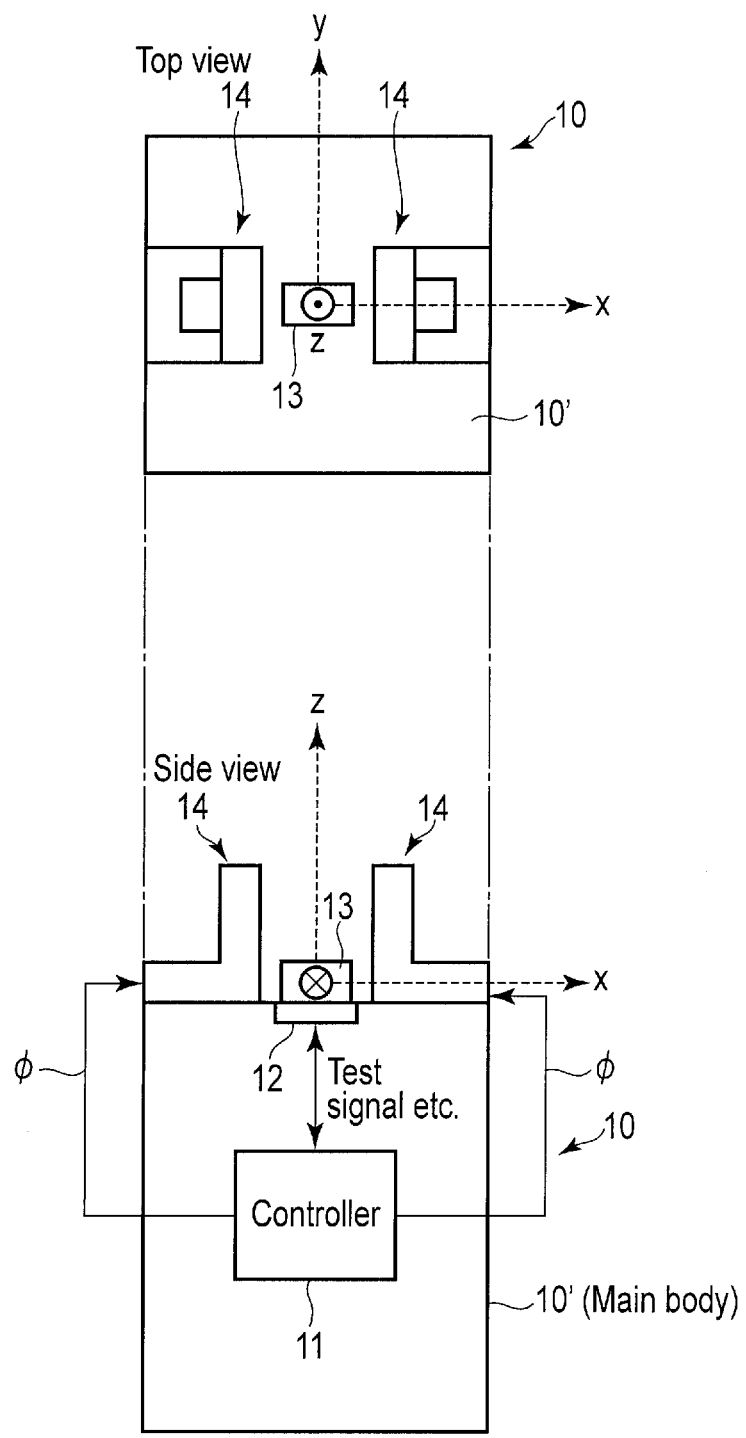
F I G. 11

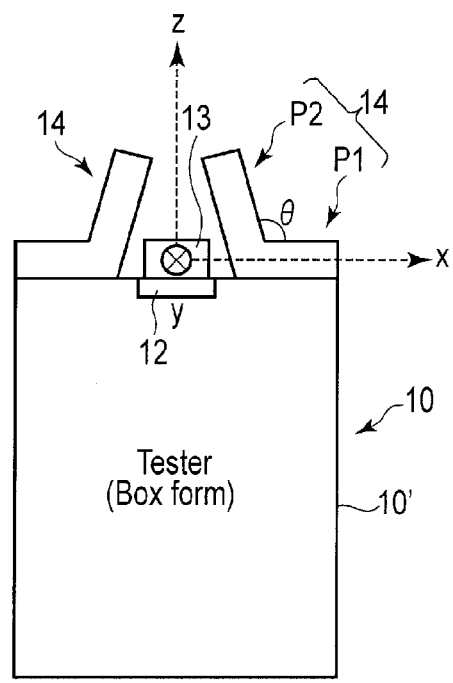
F I G. 13
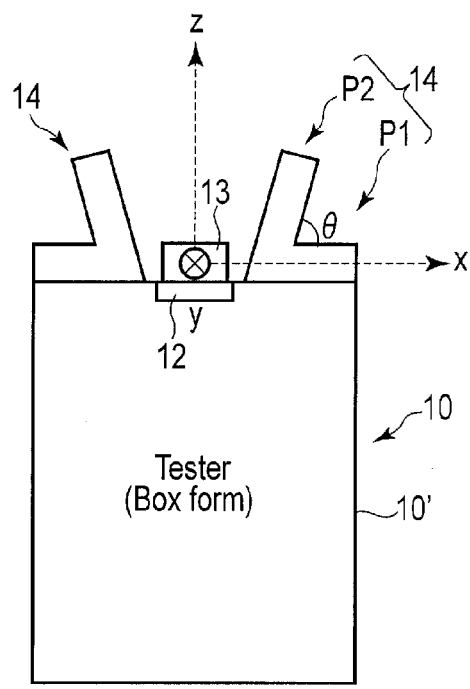
F I G. 14

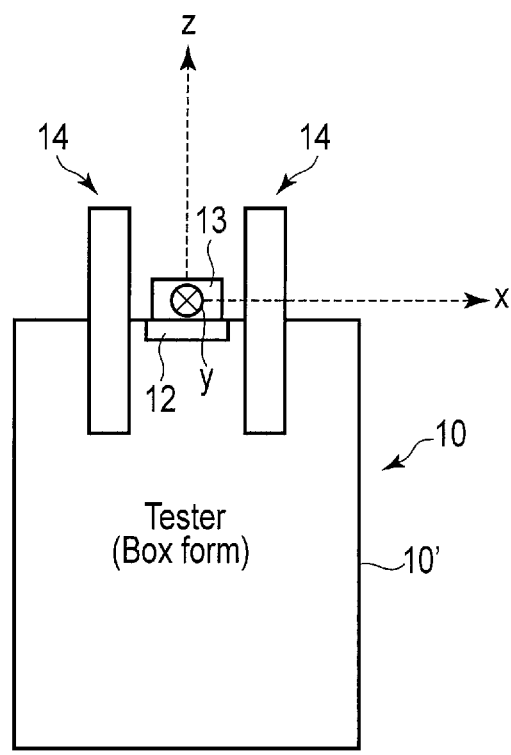
F I G. 15

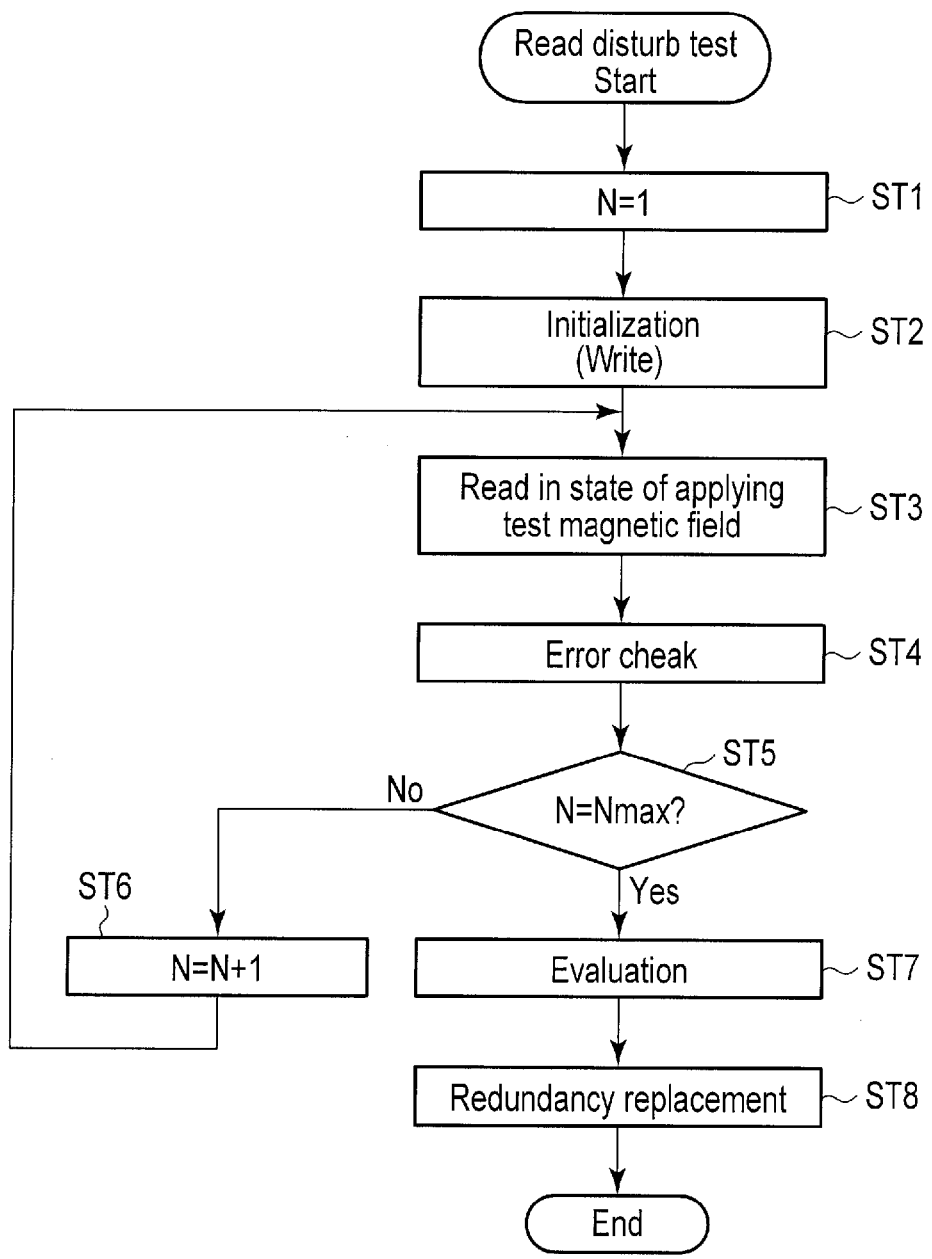
F I G. 17A

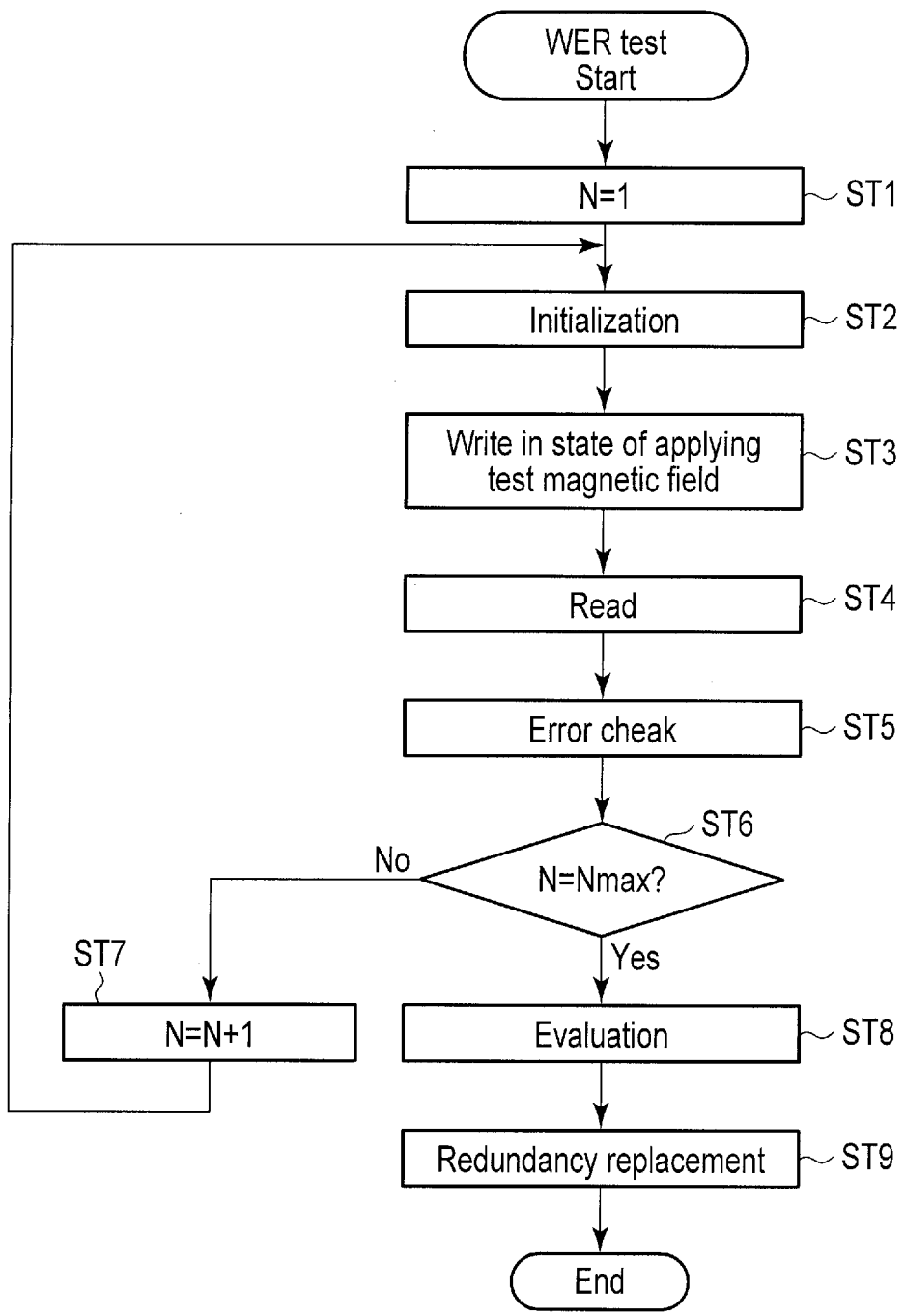
F I G. 18A

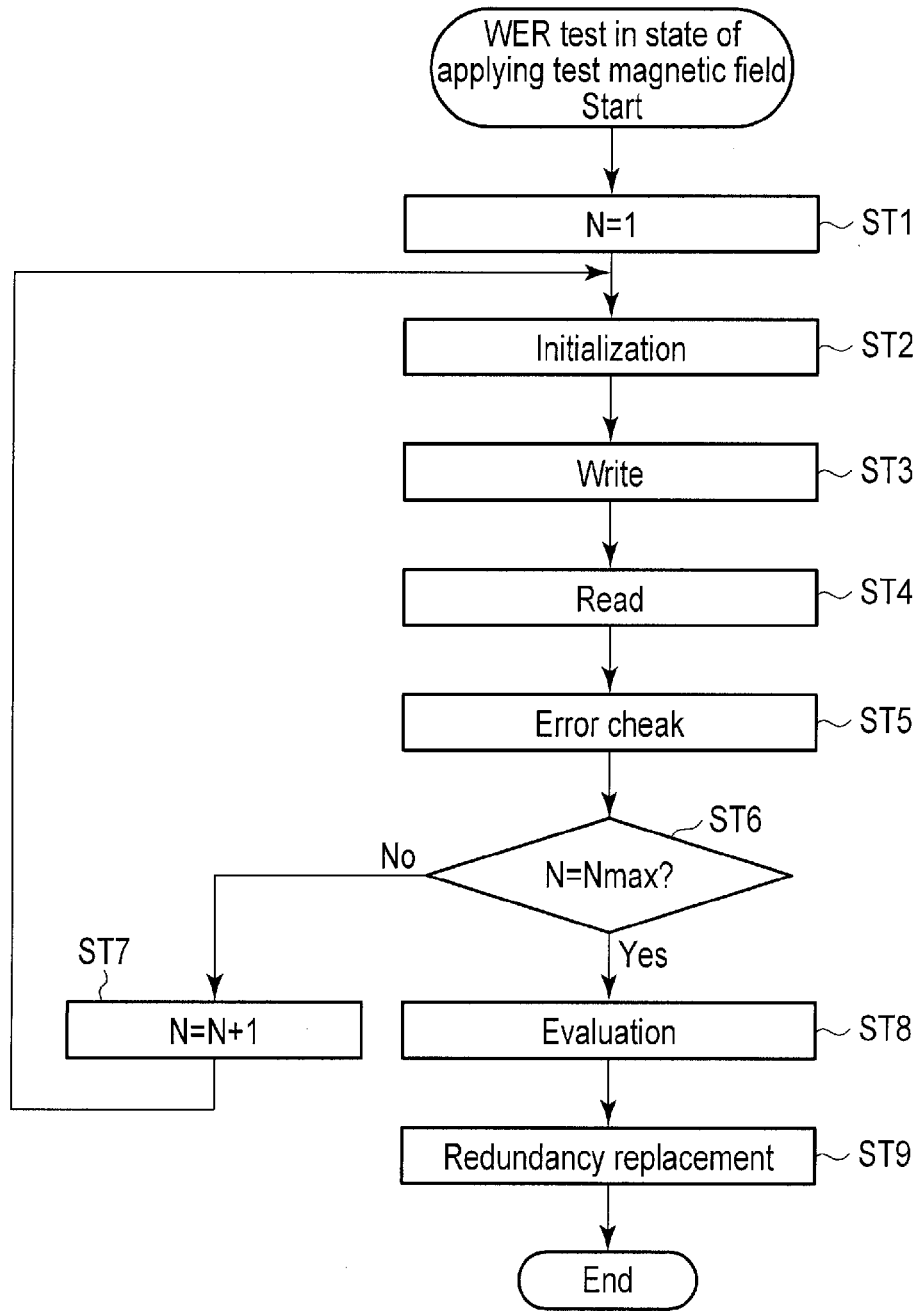
F I G. 18B

ELECTROMAGNET, TESTER AND METHOD OF MANUFACTURING MAGNETIC MEMORY

CROSS-REFERENCE TO RELATED APPLICATIONS

This application claims the benefit of U.S. Provisional Application No. 62/039,098, filed Aug. 19, 2014, the entire contents of which are incorporated herein by reference.

FIELD

Embodiments described herein relate generally to an electromagnet, a tester and a method of manufacturing a magnetic memory.

BACKGROUND

In a magnetic memory with magnetoresistive effect elements, such as a spin torque transfer magnetic random access memory (STT-MRAM), the current necessary for the magnetization inversion of the magnetoresistive effect elements is defined by the current density. Namely, the magnetic memory has such scalability that the amount of current necessary for magnetization inversion decreases as the size of the magnetoresistive effect element decreases. By virtue of this feature, the magnetic memory is regarded as one of the major candidates for next-generation memories.

To put a magnetic memory with magnetoresistive effect elements into practical use, it is necessary to detect, by a test, a fail bit that does not satisfy the specifications, and to replace it with a pass bit that satisfies the specifications, using, for example, a redundancy technique. However, as it now stands, such a magnetic memory test method is not verified.

BRIEF DESCRIPTION OF THE DRAWINGS

FIG. 1 is a block diagram showing a system example for testing a magnetic memory;

FIG. 2 is a perspective view showing a package as a magnetic memory example;

FIG. 7 is a view showing a simulated test magnetic field corresponding to a magnetic field generated by the example of FIG. 6;

FIG. 11 is a schematic view showing a test system example utilizing the electromagnet of FIG. 6;

FIGS. 13 to 15 are schematic views showing modifications of the test system;

FIGS. 17A and 17B are flowcharts illustrating read disturb test examples; and

FIGS. 18A and 18B are flowcharts illustrating WER test examples.

DETAILED DESCRIPTION

Figure 3:
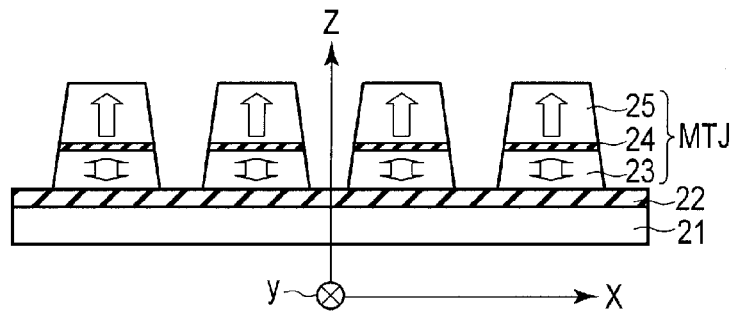
FIGS. 3 and 4 are cross-sectional views showing a magnetoresistive effect element example in the magnetic memory.

In general, according to one embodiment, an electromagnet comprises: a first electromagnet coil having a first portion and a second portion. The first portion of the first electromagnet coil extends in a direction in parallel with a first plane. The second portion of the first electromagnet coil extends in a direction in parallel with a second plane. The first and second planes intersect at a predetermined angle.

[Test Method for Magnetic Memory]

Tests necessary for guaranteeing the operation of a magnetic memory include a retention test, a read disturb test, a write error rate (WER) test, etc.

The magnetic memory is a memory that uses magnetoresistive effect elements as memory cells. The magnetoresistive effect element is an element that has a reference layer of constant magnetization, a memory layer of variable magnetization, and a non-magnetic insulating layer therebetween.

Retention is an index indicative of a time for which the magnetic memory can continuously store data. Read disturb is indicative of a phenomenon in which the magnetization of the memory layer is caused by a read current. Write error is indicative of a phenomenon in which the probability of accurate data reading is less than 1 because of heat fluctuation.

To perform the above tests, the magnetic memory must be located within a test magnetic field. In order to enable a device with the magnetic memory to operate normally, the intensity of the test magnetic field is determined in consideration of an external magnetic field that may be applied to the magnetic memory. For instance, it is known that a mobile device will receive an external magnetic field of about 100 [Oe].

Therefore, the test magnetic field used for the magnetic memory test method must have an intensity of 100 [Oe] or more.

[Tester]

FIG. 1 shows an example of a tester for testing a magnetic memory.

The tester 10 comprises a controller 11 and an interface portion 12. The controller 11 includes a section for generating a test signal needed for performing a test for guaranteeing the operation of a magnetic memory 13, and a section for controlling the test. The magnetic memory 13 is connected to the controller 11 by the interface portion 12. The interface portion 12 has a socket structure capable of fitting the magnetic memory therein.

At least while the magnetic memory 13 is being tested by a test signal from the controller 11, a test magnetic field generating portion 14 generates a test magnetic field. The test magnetic field generating portion 14 may be driven independently of the tester 10, or be driven by the controller 11 in the tester 10 (as indicated by the broken line).

As shown in FIG. 2, the test magnetic field is an x-directional magnetic field Mx, a y-directional magnetic field My, or a z-directional magnetic field Mz distributed with respect to, for example, the package of the magnetic memory 13.

Alternatively, the test magnetic field may be a combination of these magnetic fields MX, My and Mz.

For instance, the test magnetic field may be a combination of the x-directional magnetic field Mx and the y-directional magnetic field My, of the x-directional magnetic field Mz and the z-directional magnetic field Mz, of the y-directional magnetic field My and the Z-directional magnetic field Mz, or of the x-directional magnetic field Mx, the y-directional magnetic field My and the z-directional magnetic field Mz.

Further, when the magnetoresistive effect element MTJ in the magnetic memory 13 is provided on an insulating layer 22 on a semiconductor substrate 21, and comprises a memory layer 23 having a variable vertical magnetization, a reference layer 25 having a constant vertical magnetization, and a non-magnetic insulating layer 24 interposed therebetween, it is desirable to align the vertical direction of the magnetization with the z direction, as is shown in FIG. 3.

However, the term "vertical" or "vertical direction" means "vertical" or "vertical direction" with respect to the upper surface of the semiconductor substrate 21 on which the magnetoresistive effect element MTJ is formed.

Figure 4:
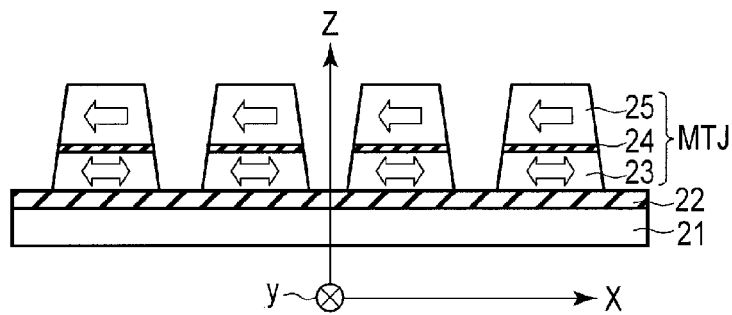

Furthermore, when the magnetoresistive effect element MTJ in the magnetic memory 13 is provided on the insulating layer 22 on the semiconductor substrate 21, and comprises a memory layer 23 having a variable in-plane magnetization, a reference layer 25 having a constant in-plane magnetization, and a non-magnetic insulating layer 24 interposed therebetween, it is desirable to align the in-plane direction of the magnetization with the x or y direction, as is shown in FIG. 4.

However, the term "in-plane" or "in-plane direction" means "horizontal" or "horizontal direction" with respect to the upper surface of the semiconductor substrate 21 on which the magnetoresistive effect element MTJ is formed.

A magnetic shield portion 15 has a space to be shielded by an external magnetic field. The tester 10 and the test magnetic field generating portion 14 are provided within the space.

It is desirable that the magnetic shield portion 15 be formed of Ni, Fe, Co, Ni—Fe alloy, Fe—Co alloy, $Fe_2O_4$ containing Ni, Mn or Zn, etc. To enhance the external magnetic field shielding effect, the magnetic shield portion 15 has a box form thicker than 100 nm and thinner than 10 mm, and desirably has a thickness of 1 mm to 5 mm.

However, the magnetic shield portion 15 may be omitted. Namely, when a detailed test is performed to detect a critical defect, the magnetic shield portion 12 is needed, while if a rough test is performed to detect, for example, a general defect that does not include a critical one, the magnetic shield portion 15 is not needed.

When the above-described tester 10 performs a high-speed test, it is important to locate the magnetic memory 13 near the tester 10 via the interface portion 12. Namely, when the tester 10 and the magnetic memory 13 are connected by a distribution cable, the pulse width, pulse height, leading edge and trailing edge of an input pulse will gradually deviate from its ideal shape in accordance with the length of the cable because of the delay in the cable. Further, when the distribution cable is used, pulses of 100 MHz or more cannot be input, whereby it is possible that the magnetic memory 13 will be inoperative.

In view of the above, it is desirable that the interface portion 12 be, for example, a socket that enables the magnetic memory 13 to be located near the tester 10.

Further, to generate a test magnetic field with a high intensity of, for example, 100 [Oe] or more, it is desirable that the test magnetic field generating portion 14 be an electromagnet, such as a Helmholtz electromagnet.

If an electromagnet is used as the test magnetic field generating portion 14, it is necessary to consider the positional relationship between the tester 10 and the test magnetic field generating portion 14. This is because the tester 10 is expensive and hence change in its structure is undesirable. Actually, however, the dimensions of the existing tester 10 are predetermined, and if this tester is combined with an electromagnet, the magnetic memory 13 and the electromagnet will be separate from each other by a great distance, with the result that, for example, a sufficiently large test magnetic field cannot be applied to the magnetic memory.

A description will now be given of the test magnetic field generating portion (electromagnet) 14 for overcoming the above disadvantage, and of a system example in which the test magnetic field generating portion 14 and the tester 10 are combined.

[Test Magnetic Field Generating Portion]

Figure 5:
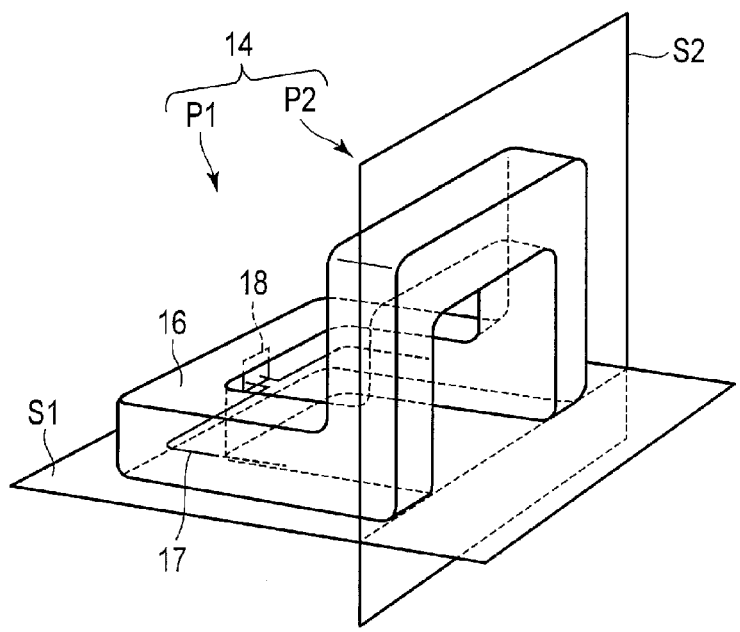
FIG. 5 is a perspective view showing an example of an electromagnet.

FIG. 5 shows an example of an electromagnet.

The electromagnet 14 is, for example, a Helmholtz electromagnet, and can be used as the test magnetic field generating portion. The figure shows the outer form of the electromagnet 14. Namely, the electromagnet 14 comprises, for example, a tubular body 16, and an electromagnetic coil 17 housed in a hollow portion in the tube-shaped (tubular) body 16. An electrode 18 for flowing a current to the electromagnetic coil 17 is provided in the tubular body 16.

The electrode 18 of the electromagnet 14 is connected to, for example, the controller 11 shown in FIG. 1. The controller 11 shown in FIG. 1 controls the intensity and direction of the magnetic field generated by the electromagnet 14 by changing the amount and direction of the current flowing through the electromagnet 14.

The tube-shaped (tubular) body 16 has a bended ring (bent frame) form.

The ring form indicates that the tubular body 16 has a closed structure. In the embodiment, the tube-shaped body 16 has a cross section of a square form. However, the body is not limited to the form. For instance, the cross section may have a circular form or a polygonal form.

Further, the term "bended (bent)" means that the electromagnet 14 has a first portion P1 and a second portion P2 which do not exist on a single plane.

The first portion P1 is a portion in which the electromagnetic coil 17 extends parallel to a first plane S1 (i.e., the current flows in a direction parallel to the first plane S1). Similarly, the second portion P2 is a portion in which the electromagnetic coil 17 extends parallel to a second plane S2 (i.e., the current flows in a direction parallel to the second plane S2).

The first and second planes S1 and S2 intersect each other at a constant angle θ. The constant angle θ is, for example, 90°. The constant angle θ can be selected from a range of 60° to 120°.

The ratio between the first and second portions P1 and P2 may be 50:50, or be other values. For instance, the first portion P1 may be greater than the second portion P2, or the second portion P2 may be greater than the first portion P1.

Further, it is desirable that the surface (in particular, the bottom) of the first portion P1 parallel to the first plane S1 be flat so that the electromagnet 14 can be easily placed thereon.

It is desirable that the tube-shaped body 16 be formed of a non-magnetic member having a magnetic field passing function.

Figure 6:
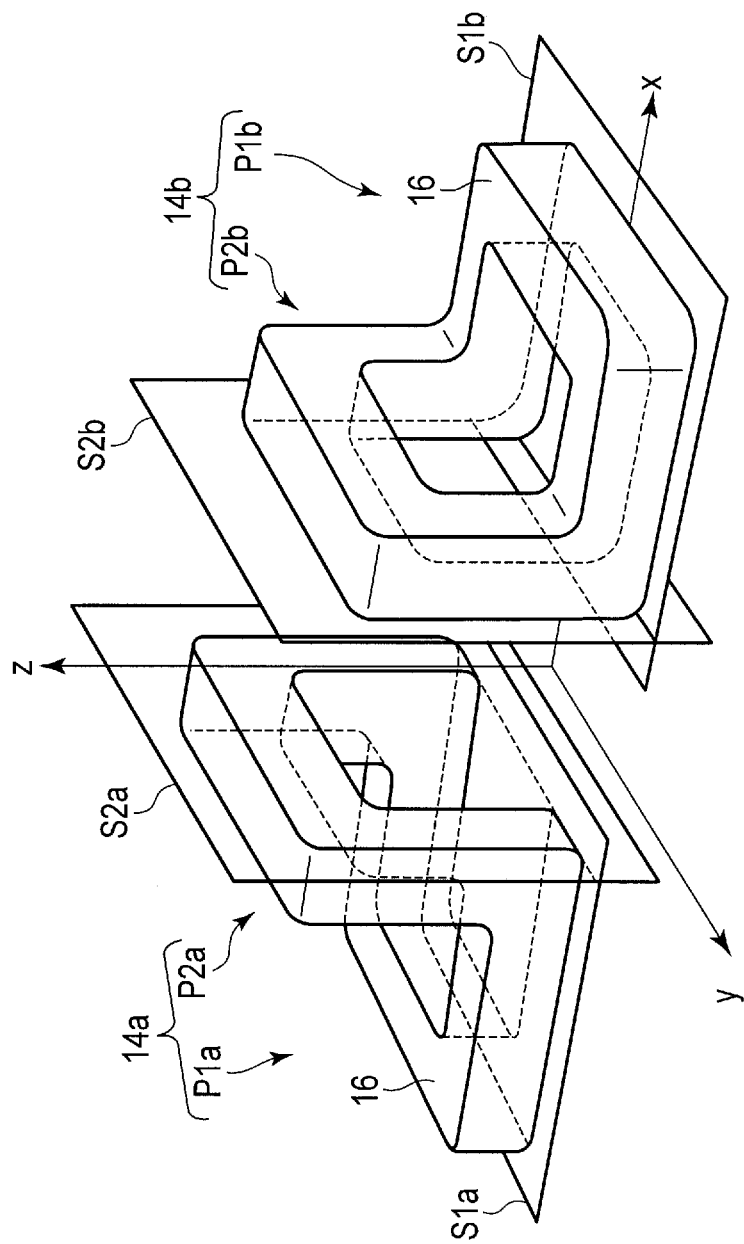
FIG. 6 is a perspective view showing a combination example of electromagnets.

FIG. 6 shows an example in which a plurality of electromagnets are combined.

In this example, two electromagnets 14a and 14b are combined. Each of the electromagnets 14a and 14b corresponds to the electromagnet 14 shown in FIG. 5.

The two electromagnets 14a and 14b are arranged to oppose each other.

For instance, where a three-dimensional coordinate system is set in the figure, a first plane S1a, on which the first portion P1a of the electromagnet 14a is placed, and a second plane S1b, on which the first portion P1b of the electromagnet 14b is placed, are arranged on a single plane (x-y plane), and a second plane S2a, on which the second portion P2a of the electromagnet 14a is placed, and a second plane S2b, on which the second portion P2b of the electromagnet 14b is placed, are arranged parallel to each other. Assume here that the second planes S2a and S2b are both parallel to the y-z plane.

In this case, the combination of the two electromagnets 14a and 14b enables an x-directional magnetic field of high uniformity to be generated within a predetermined range. Thus, the magnetic field generated by the two electromagnets 14a and 14b can be used as a test magnetic field for the tester described with reference to FIGS. 1 to 4.

FIG. 7 is a view showing a simulated magnetic field to be generated by the example of FIG. 6.

This figure shows a magnetic field generated when the two electromagnets 14a and 14b are separate from each other by a distance d, and currents Ia and Ib are flown through the two electromagnets 14a and 14b, respectively. The distance d can be selected from a range of 5 cm to 50 cm.

For instance, when the magnetic memory (e.g., package) 13 is provided between the two electromagnets 14a and 14b, and when such a three-dimensional coordinate system as shown in the figure is set, it can be understood that a z-directional magnetic field having high uniformity is obtained in an x-directional range d, and an x-directional magnetic field having high uniformity is obtained in a z-directional range R. The range d is determined by the distance between the two electromagnets 14a and 14b. In principle, the range d may be an arbitrary distance, and practically can be set to 1 cm to 30 cm.

Further, the range R ranges from the position several cm below the bottoms B1 of the first portions P1a and P1b of the two electromagnets 14a and 14b, to the position several cm below the bottoms B2 of the second portions P2a and P2b of the two electromagnets 14a and 14b.

Accordingly, if the magnetic memory 13 is placed within the range d in the x direction, and within the range R in the z direction, the magnetic memory 13 can be tested by the tester shown in FIGS. 1 to 4.

Further, if the test magnetic field is generated using the combination of the two electromagnets 14a and 14b shown in FIGS. 6 and 7, various test magnetic fields can be applied to the magnetic memory 13 by changing the distance d between the electromagnets, and the amounts and directions of the currents Ia and Ib.

Furthermore, although the embodiment is directed to an example of an electromagnet for generating the x-directional magnetic field, the x-directional magnetic field Mx, the y-directional magnetic field My and the z-directional magnetic field Mz can be controlled independently of each other by increasing the number of electromagnets. In this case, by changing the magnetization direction and/or intensity of each magnetic field Mx, My and Mz, a test magnetic field of an arbitrary intensity and an arbitrary magnetization direction can be applied to the magnetic memory 13.

This will now be described.

Figure 8A:
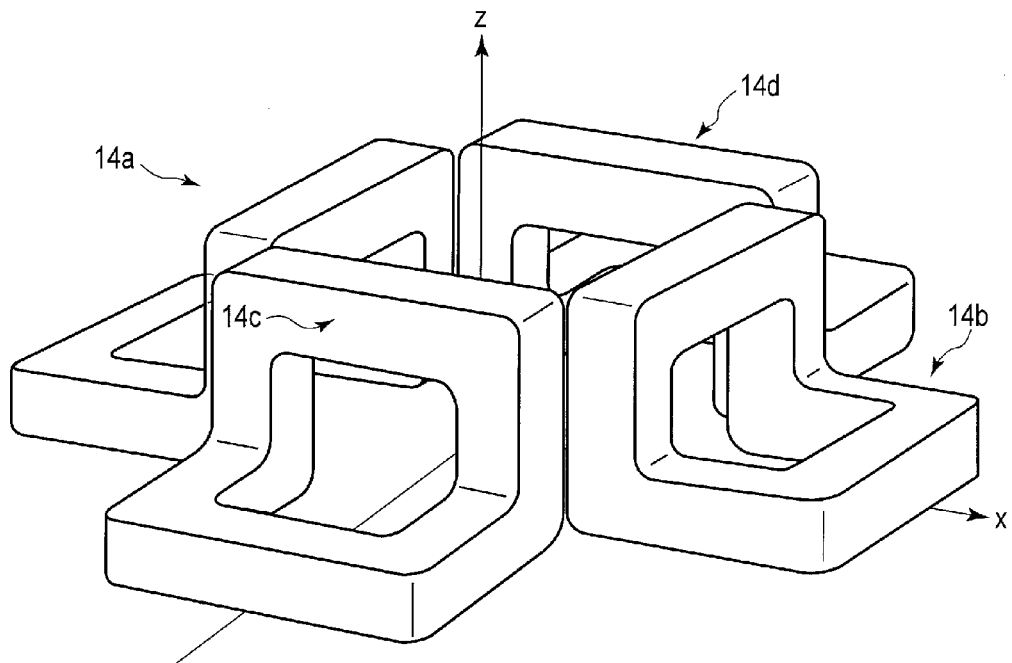
FIGS. 8A, 8B, 9, 10A and 10B are perspective views showing combination examples of electromagnets.

FIG. 8A shows a combination example of four electromagnets.

In this example, each of the four electromagnets 14a, 14b, 14c and 14d corresponds to the electromagnet 14 shown in FIG. 5.

The two electromagnets 14a and 14b are opposed to each other. The two electromagnets 14a and 14b generate an x-directional magnetic field as in the example shown in FIGS. 6 and 7. Similarly, the two electromagnets 14c and 14d are opposed to each other. The two electromagnets 14c and 14d generate a y-directional magnetic field.

Namely, in this example, when a magnetic memory is placed among the four electromagnets 14a, 14b, 14c and 14d, the x-directional magnetic field Mx and the y-directional magnetic field My are independently applied to the magnetic memory.

In this case, by changing the magnetization direction and/or intensity of each magnetic field Mx and My, a test magnetic field of an arbitrary intensity and direction can be applied to the magnetic memory.

Figure 8B:
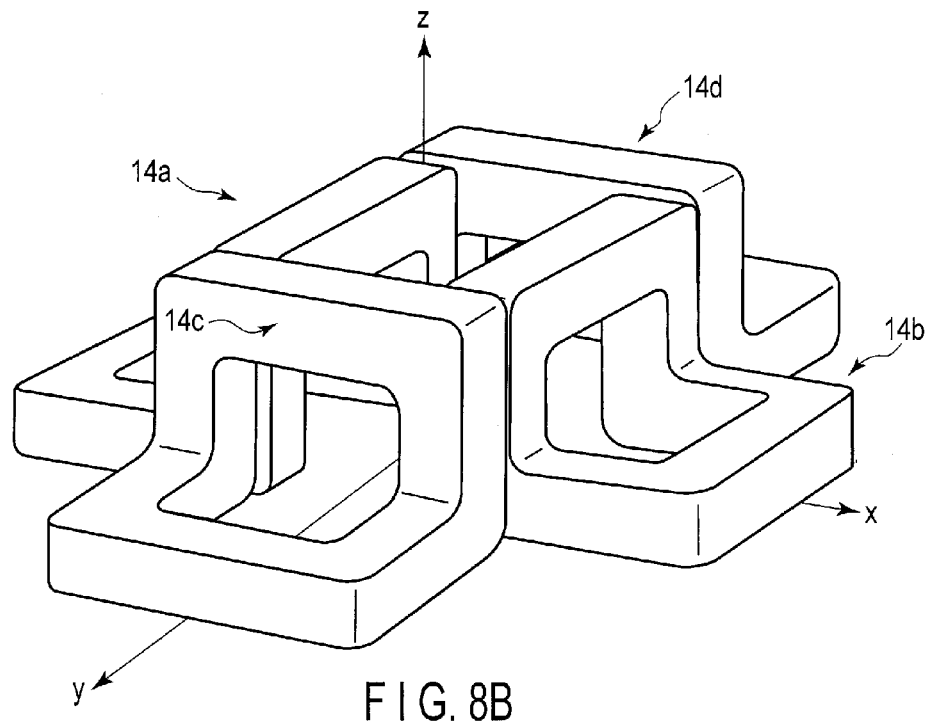

In this example, the distance between the two electromagnets 14a and 14b is equal to the distance between the two electromagnets 14c and 14d. However, the former may differ from the latter. For instance, the distance between the two electromagnets 14a and 14b may be shorter than the distance between the two electromagnets 14c and 14d, as is shown in FIG. 8B.

Figure 9:
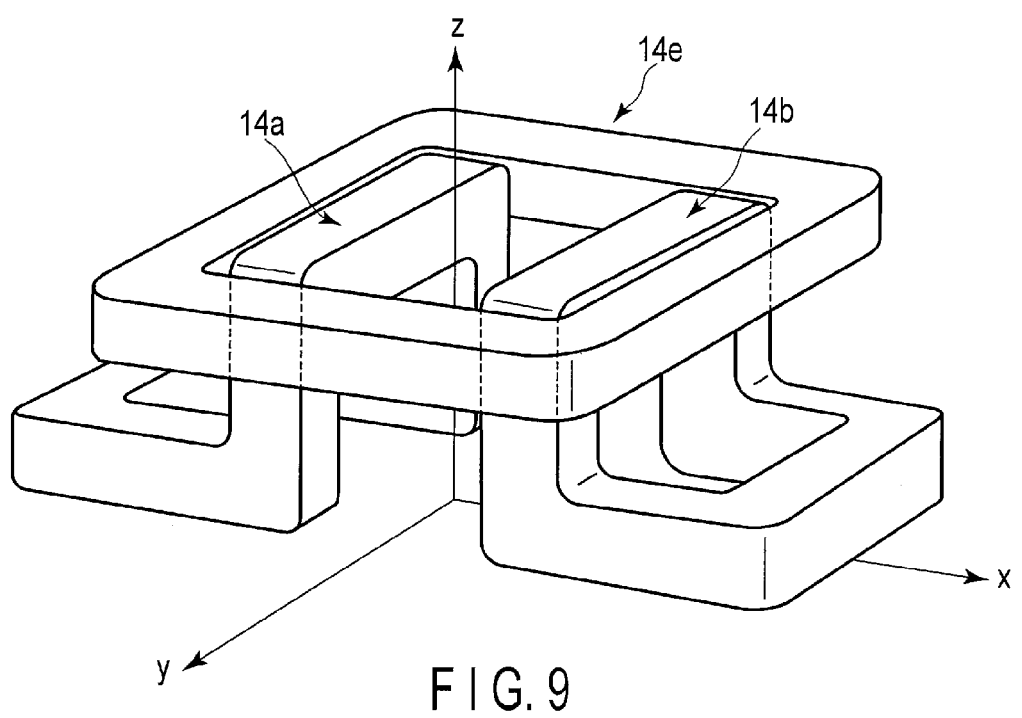

FIG. 9 shows a combination example of three electromagnets.

In this example, each of two electromagnets 14a and 14b corresponds to the electromagnet 14 shown in FIG. 5. Further, the other electromagnet 14e is a general Helmholtz electromagnet of a ring form that is not bent.

The two electromagnets 14a and 14b are opposed to each other. The two electromagnets 14a and 14b generate an x-directional magnetic field, as in the example of FIGS. 6 and 7. The other electromagnet 14e generates a z-directional magnetic field.

Namely, in this example, by locating the magnetic memory among the three electromagnets 14a, 14b and 14e, an x-directional magnetic field Mx and a z-directional magnetic field Mz are independently applied to the magnetic memory.

In this case, by changing the magnetization direction and/or intensity of each magnetic field Mx and Mz, a test magnetic field of an arbitrary intensity and direction can be applied to the magnetic memory.

Figure 10A:
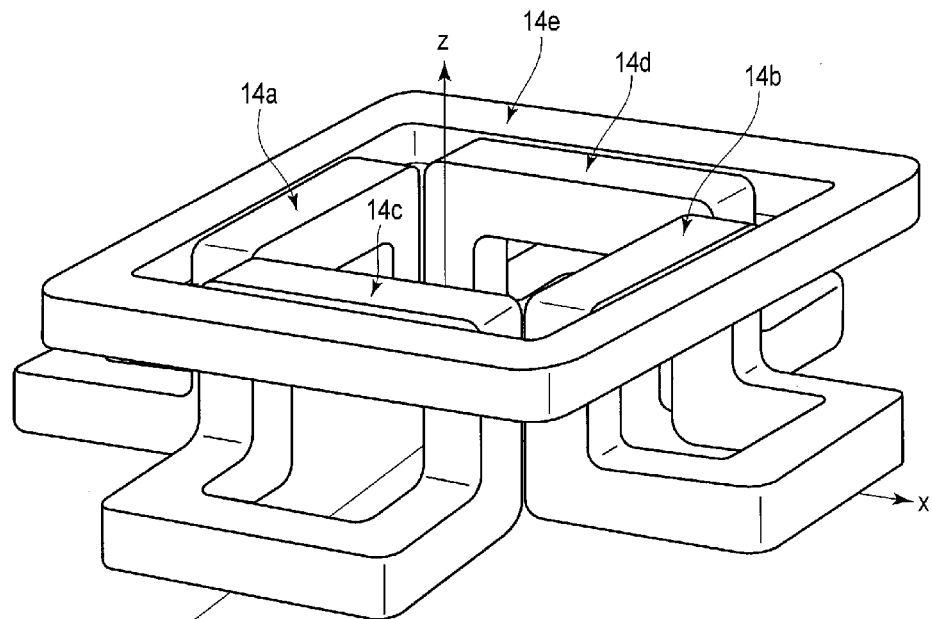

FIG. 10A shows a combination example of five electromagnets.

In this example, each of the four electromagnets 14a, 14b, 14c and 14d corresponds to the electromagnet 14 shown in FIG. 5. Further, the other electromagnet 14e is a general Helmholtz electromagnet of a ring form that is not bent.

The two electromagnets 14a and 14b are opposed to each other. The two electromagnets 14a and 14b generate an x-directional magnetic field as in the example shown in FIGS. 6 and 7. Similarly, the two electromagnets 14c and 14d are opposed to each other. The two electromagnets 14c and 14d generate a y-directional magnetic field. Further, the other electromagnet 14e generates a z-directional magnetic field.

Thus, in this example, by locating the magnetic memory among the electromagnets 14a, 14b, 14c, 14d and 14e, the x-directional magnetic field Mx, the y-directional magnetic field My and the z-directional magnetic field Mz can be applied to the magnetic memory independently of each other.

In this example, by changing the magnetization direction and/or intensity of each magnetic field Mx, My and Mz, a test magnetic field of an arbitrary intensity and direction can be applied to the magnetic memory.

Figure 10B:
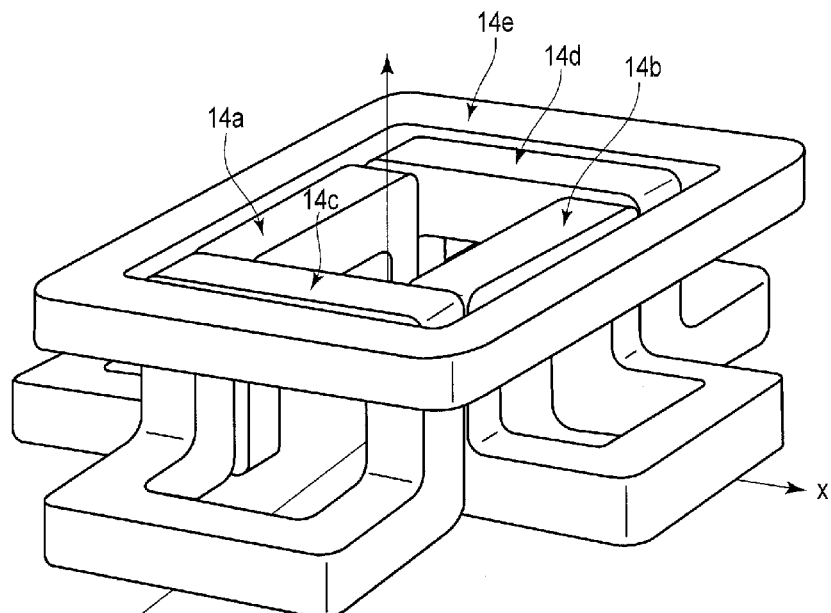

Although in this example, the distance between the two electromagnets 14a and 14b is equal to the distance between the two electromagnets 14c and 14d, they may differ from each other. For instance, as shown in FIG. 10B, the distance between the two electromagnets 14a and 14b may be shorter than the distance between the two electromagnets 14c and 14d.

[System Example Obtained by Combining the Test Magnetic Field Generating Portion and the Tester]

A description will be given of a combination example of the above-described test magnetic field generating portion and tester.

FIG. 11 shows a test system example.

The test system utilizes the electromagnets shown in FIG. 6. More specifically, a tester 10 comprises a box-formed main body 10' with a flat upper surface, an interface portion 12 with a flat upper surface on which the magnetic memory 13 is placed, and a controller 11 contained in the main body 10' and used to generate, for example, a test signal for controlling the test of the magnetic memory 13.

The interface portion 12 is, for example, a socket in which the magnetic memory 13 can be fitted, and is provided in the upper surface of the main body 10'.

Two electromagnets (two electromagnetic coils) 14 are placed on the upper surface of the main body 10', opposed to each other. In this case, since the two electromagnets 14 have respective first portions with flat bottoms, they can be placed stably, as is described above. Further, the interface portion 12 is interposed between the two electromagnets 14.

The controller 11 controls the two electromagnets 14 using a control signal φ. For instance, the controller 11 controls the intensity and direction of the magnetic field generated by the two electromagnets 14 by changing the amounts and directions of currents flowing through the electromagnetic coils of the two electromagnets 14.

The magnetic field generated by the two electromagnets 14 is parallel to the flat upper surface of the main body 10' in the interface portion 12. This magnetic field will hereinafter be referred to as, for example, an x-directional magnetic field in the three-dimensional coordinate system.

Further, if in the example, the electromagnets shown in FIG. 8 are used, a y-directional magnetic field (parallel to the flat upper surface of the main body 10') can be generated as well as the x-directional magnetic field. Furthermore, if in the example, the electromagnets shown in FIG. 9 are used, the y-directional magnetic field and a z-directional magnetic field (perpendicular to the flat upper surface of the main body 10') can be generated as well as the x-directional magnetic field.

By changing the magnetization direction and/or intensity of each magnetic field Mx, My and Mz, a test magnetic field of an arbitrary intensity and direction can be applied to the magnetic memory 13.

In the test system according to the embodiment, a high intensity magnetic field having high uniformity can be applied to the magnetic memory 13 without changing, for example, the outer form and/or structure of the tester 10.

Figure 12:
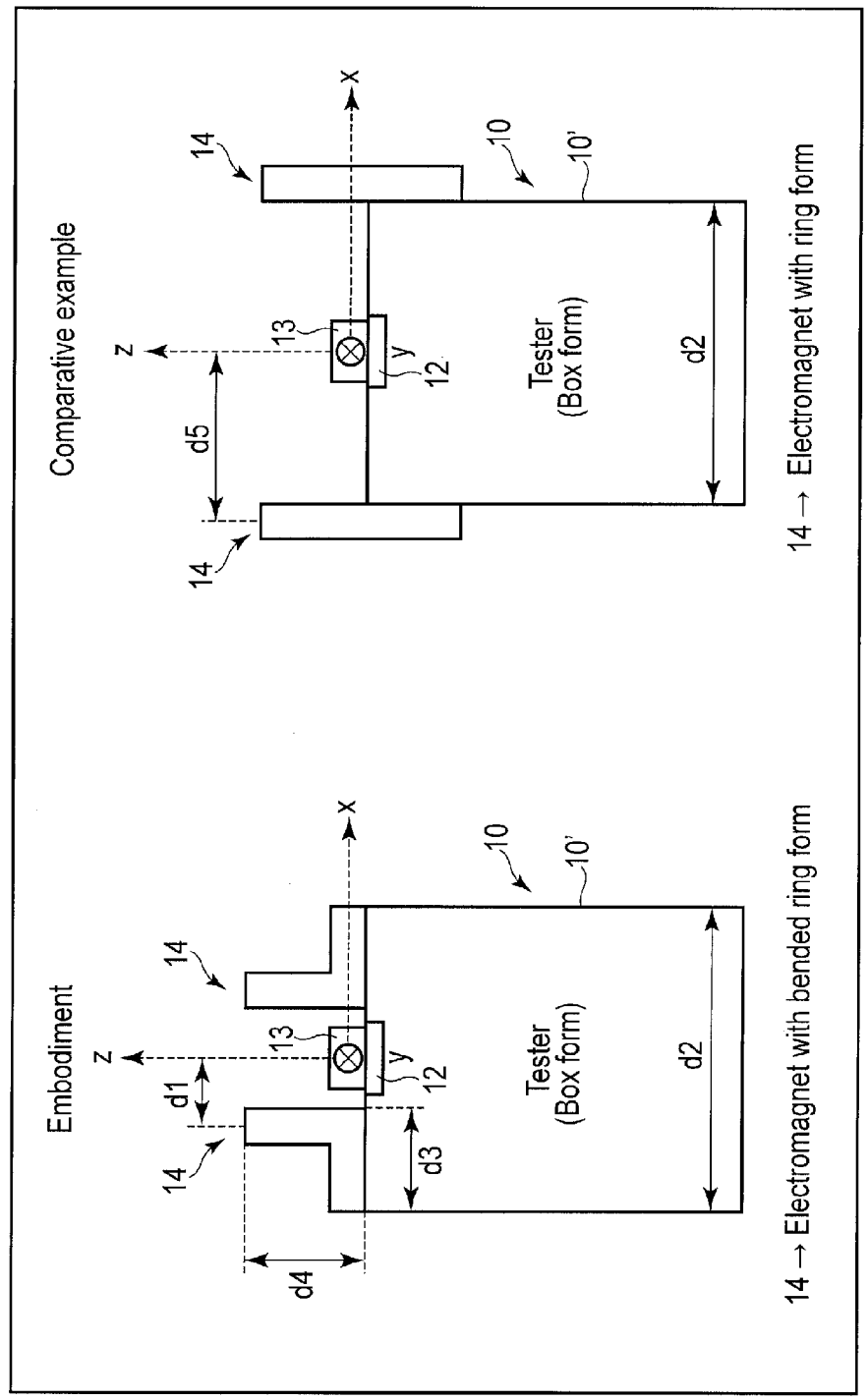
FIG. 12 is a view for explaining the advantage of the test system shown in FIG. 11.

FIG. 12 shows an effect of the test system shown in FIG. 11.

Since in the embodiment, each electromagnet 14 has a bended ring form (bent frame form), it can be placed on the flat upper surface of the main body 10' of the tester 10. At this time, the distance d1 between the magnetic memory 13 and each electromagnet 14 can be minimized without being influenced by the outer form of the tester 10. The minimum distance d1 means a distance at which each electromagnet 14 contacts the interface portion 12 or the magnetic memory 13.

By thus causing each electromagnet 14 to approach the magnetic memory 13, a high intensity magnetic field of high uniformity can be applied to the magnetic memory 13.

Dimension examples of the tester 10 and the electromagnet 14 will be described. The lateral dimension of the main body 10' is 50 cm×50 cm (d2=50 cm), the lateral dimension of the electromagnet 14 is 20 cm×20 cm (d3=20 cm), and the longitudinal dimension of the electromagnet 14 is 30 cm (d4=30 cm).

In contrast, in a comparative example, the electromagnet 14 has a ring form that is not bent. Therefore, the electromagnet cannot be placed on the flat upper surface of the main body 10' of the tester 10. In this case, the electromagnet 14 must be located to contact a side surface of the main body 10'. As a result, the distance d5 between the magnetic memory 13 and the electromagnet 14 depends upon the outer form of the tester 10, and is greater than half the lateral dimension (d2/2) of the main body 10'.

FIGS. 13 to 15 show modifications of the test system of FIG. 11.

These modifications are characterized in the form of the electromagnet 14.

In the example of FIG. 13, the angle θ between the first portion (first plane) P1 of each electromagnet 14 and the second portion (second plane) P2 of the same is greater than 90°. In the example of FIG. 14, the angle θ between the first portion (first plane) P1 of each electromagnet 14 and the second portion (second plane) P2 of the same is smaller than 90°.

By thus changing the angle θ, the magnetic field applied to the magnetic memory 13 can be changed. The angle θ is determined in consideration of, for example, the type of the magnetic memory 13 and/or the evaluation method.

In the example of FIG. 15, each electromagnet 14 has a ring form that is not bent. Namely, each electromagnet 14 is a conventional Helmholtz electromagnet. However, in order to apply a high intensity magnetic field of high uniformity to the magnetic memory 13, each electromagnet 14 is located close to the magnetic memory 13. Since in this case, each electromagnet 14 must be set in the tester 10, the outer form of the tester 10 must be changed.

[Test Method]

A magnetic memory test method utilizing the above-described test system will be described.

(1) Retention Test

For instance, in the test system of FIG. 11, if a retention test is performed with a test magnetic field generated by the electromagnets 14, it can be accelerated. The controller 11 performs the retention test by executing at least the following subsequent steps:

First step

First data is written to the magnetic memory 13.

Second step

A test magnetic field is applied to the magnetic memory 13 for a predetermined period of time.

Third step

Second data is read from the magnetic memory 13.

Fourth step

The characteristics of the magnetic memory 13 are evaluated by comparing the first and second data.

Figure 16A:
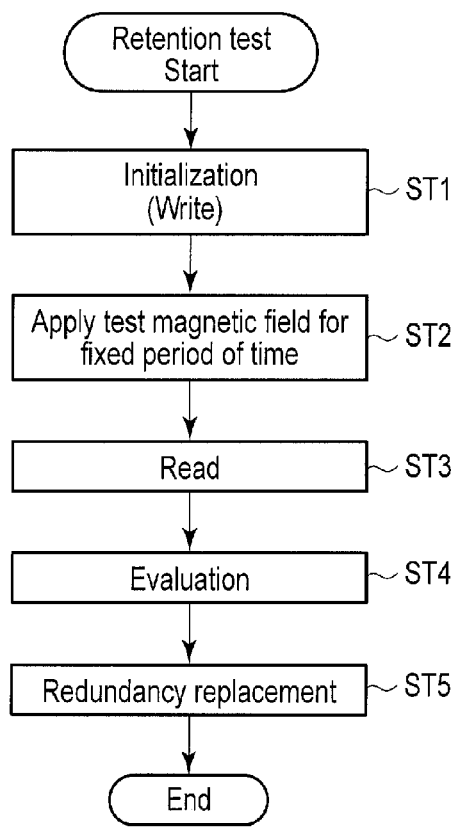
FIGS. 16A and 16B are flowcharts illustrating retention test examples.

More specifically, the retention test is performed in accordance with the flowchart of FIG. 16A.

Firstly, data is written to the magnetic memory 13 (step ST1).

For instance, initialization for causing all magnetoresistive effect elements of the magnetic memory 13 to have the same data is performed. Namely, all magnetoresistive effect elements of the magnetic memory 13 are set, by writing operation, to a low resistance state (a state of "0") or a high resistance state (a state of "1").

Subsequently, a test magnetic field is applied to the magnetic memory 13 for a predetermined period of time (step ST2).

When, for example, the magnetoresistive effect elements of the magnetic memory 13 are set in the low resistance state (in a parallel state), a test magnetic field having a magnetization direction opposite to the magnetization direction of a memory layer and a reference layer is applied to the magnetic memory 13. In contrast, when the magnetoresistive effect elements of the magnetic memory 13 are set in the high resistance state (in an antiparallel state), a test magnetic field having a magnetization direction opposite to the magnetization direction of the memory layer but identical to that of the reference layer is applied to the magnetic memory 13.

Further, assuming that the magnetization direction identical to that of the memory layer is 0°, and the magnetization direction opposite to that of the memory layer is 180°, the test magnetic field can be set to an arbitrary magnetization direction within a range of 0° to 180°. For instance, when the magnetization direction of the test magnetic field is 135° (i.e., 45° from the direction opposite to the magnetization direction of the memory layer), the magnetization of the memory layer assumes a most easily reversible state (critical state). It is very effective to perform a retention test in this state.

Subsequently, data is read from the magnetic memory 13 (step ST3).

By comparing the write data with the read data, the characteristics of the magnetic memory 13 are evaluated (step ST4).

For instance, in the evaluation, fail bits, in which write data is not identical to read data, are detected, thereby determining whether the number of the fail bits is smaller than a predetermined value.

Lastly, if the number of the fail bits is smaller than the predetermined value, the magnetic memory is determined to satisfy the specifications, and redundancy replacement for replacing the fail bits with pass bits is performed (step ST5).

In contrast, if the number of the fail bits is equal to or larger than the predetermined value, the magnetic memory is determined not to satisfy the specifications, and is therefore determined to be defective.

Figure 16B:
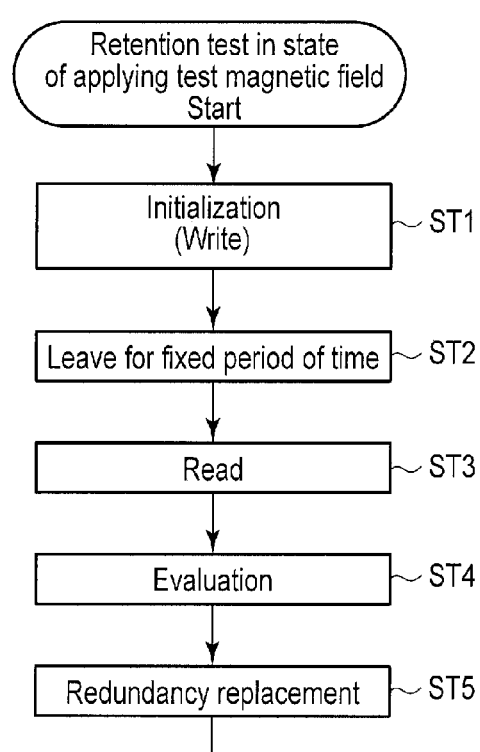

Although in the embodiment, the test magnetic field is applied to the magnetic memory 13 in step ST2, it may be applied to the magnetic memory 13 in a step other than step ST2 (e.g., in all steps) as shown in FIG. 16B.

The above-described test method enables the retention test to be performed in a short time of about 10 sec.

(2) Read Disturb Test

For instance, in the test system of FIG. 11, if a read disturb test is performed with a test magnetic field generated by the electromagnets 14, it can be accelerated. The controller 11 performs the read disturb test by executing at least the following subsequent steps:

First step
First data is written to the magnetic memory 13.
Second step
Second data is read from the magnetic memory 13 with a test magnetic field applied to the magnetic memory 13.

Third step
The characteristics of the magnetic memory 13 are evaluated by comparing the first and second data.

More specifically, the read disturb test is performed in accordance with the flowchart of FIG. 17A.

Firstly, data is written to the magnetic memory 13 (steps ST1 and ST2).

For instance, initialization for causing all magnetoresistive effect elements of the magnetic memory 13 to have the same data is performed. Namely, all magnetoresistive effect elements of the magnetic memory 13 are set, by writing operation, to a low resistance state (a state of "0") or a high resistance state (a state of "1").

Subsequently, data is read from the magnetic memory 13 with the test magnetic field applied to the magnetic memory 13 (step ST3).

When, for example, the magnetoresistive effect elements of the magnetic memory 13 are set in the low resistance state (in a parallel state), a data read is performed while a test magnetic field having a magnetization direction opposite to the magnetization direction of the memory layer and the reference layer is being applied to the magnetoresistive effect elements. In contrast, when the magnetoresistive effect elements of the magnetic memory 13 are set in the high resistance state (in an antiparallel state), a data read is performed while a test magnetic field having a magnetization direction opposite to the magnetization direction of the memory layer but identical to that of the reference layer is being applied to the magnetoresistive effect elements.

Further, assuming that the magnetization direction identical to that of the memory layer is 0°, and the magnetization direction opposite to that of the memory layer is 180° as in the case of the retention test, the test magnetic field can be set to an arbitrary magnetization direction within a range of 0° to 180°. For instance, in a state where the magnetization direction of the test magnetic field is set to 135° (critical state), the read disturb test can also be performed.

After that, fail bits, in which write data is not identical to read data, are detected by comparing the write and read data (error check). This error check is performed Nmax times for each of the magnetoresistive effect elements in the magnetic memory 13. Nmax is a natural number not less than 2 (steps ST4 to ST6).

In the read disturb test, however, the error check (step ST4) may be performed a predetermined number of times Ncheck included in the Nmax times (Ncheck<Nmax). For instance, if Nmax is 100000, i.e., if data read (step ST3) is iterated 100000 times, the number Ncheck of times of error check (step ST4) may be 5.

In this case, error check is performed when the loop count of reading reaches 10, 100, 1000, 10000 and 100000 (5 times in total).

By thus reducing the number Ncheck of times of error check, the required test time can be shortened.

After that, the magnetic memory 13 is evaluated based on the number of times each magnetoresistive effect element in the memory 13 is determined to be a fail bit (step ST7).

For instance, in the evaluation, it is determined whether the number of times each magnetoresistive effect element is determined to be a fail bit is lower than a predetermined value.

Lastly, if the number of times a magnetoresistive effect element is determined to be a fail bit is lower than the predetermined value, this magnetoresistive effect element is determined to be a pass bit. In contrast, if the number of times a magnetoresistive effect element is determined to be a fail bit is equal to or higher than the predetermined value, this magnetoresistive effect element is determined to be a fail bit, and redundancy replacement for replacing the fail bit with a pass bit is performed (step ST8).

Figure 17B:
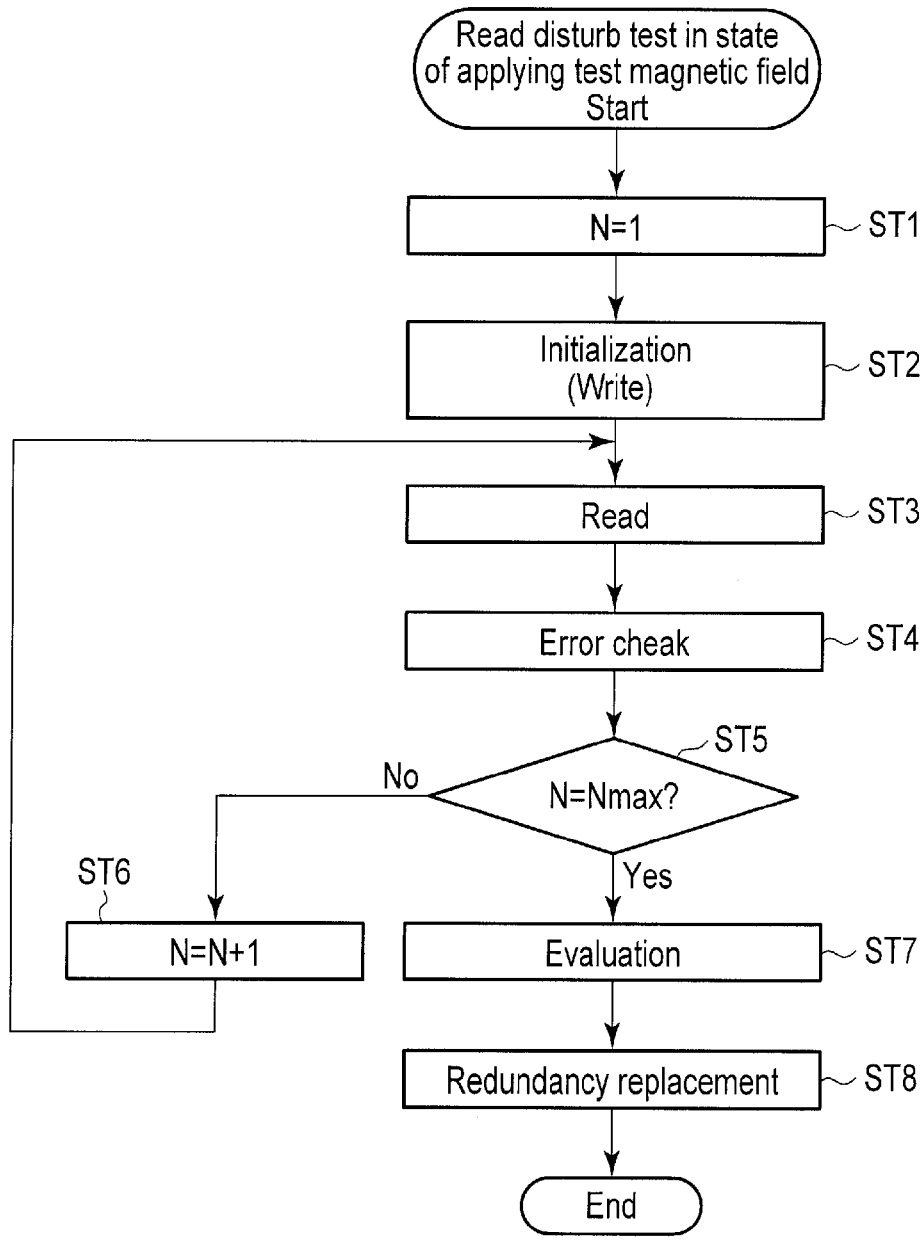

Although in the example, the test magnetic field is applied to the magnetic memory 13 in step ST3, it may be applied to the magnetic memory 13 in a step other than step ST3 (e.g., in all steps) as shown in FIG. 17B.

The above-described test method enables the read disturb test to be performed in a short time of about 12 sec.

(3) Write Error Rate (WER) Test

For instance, in the test system of FIG. 11, if a write error rate (WER) test is performed with a test magnetic field generated by the electromagnets 14, it can be accelerated. The controller 11 performs the WER test by executing at least the following subsequent steps:

First step

First data is written to the magnetic memory 13 with the test magnetic field applied to the magnetic memory 13.

Second step

Second data is read from the magnetic memory 13.

Third step

The characteristics of the magnetic memory 13 are evaluated by comparing the first and second data.

More specifically, the WER test is performed in accordance with the flowchart of FIG. 18A.

Firstly, data is written to the magnetic memory 13 (steps ST1 and ST2).

For instance, initialization for causing all magnetoresistive effect elements of the magnetic memory 13 to have the same data is performed. Namely, all magnetoresistive effect elements of the magnetic memory 13 are set, by writing operation, to a low resistance state (a state of "0") or a high resistance state (a state of "1").

Subsequently, data is again written to the magnetic memory 13 with the test magnetic field applied to the magnetic memory 13 (step ST3).

This write is performed to reverse all data stored in the magnetoresistive effect elements of the magnetic memory 13. This write is performed, while a test magnetic field having the same magnetization direction as the memory layer before writing, i.e., having a magnetization direction opposite to the magnetization direction of the memory layer expected after writing, is being applied to all magnetoresistive effect elements of the magnetic memory 13.

For instance, to switch the magnetoresistive effect elements of the magnetic memory 13 from the parallel state to the antiparallel state, a test magnetic field having the same magnetization direction as the memory layer in the parallel state before writing is applied to the magnetoresistive effect elements during writing.

Further, to switch the magnetoresistive effect elements of the magnetic memory 13 from the antiparallel state to the parallel state, a test magnetic field having the same magnetization direction as the memory layer in the antiparallel state before writing is applied to the magnetoresistive effect elements during writing.

Furthermore, assuming that the magnetization direction identical to that of the memory layer after writing is 0°, and the magnetization direction opposite to that of the memory layer after writing is 180°, the test magnetic field can be set to an arbitrary magnetization direction within a range of 0° to 180°. For instance, in a state where the magnetization direction of the test magnetic field is set to 135° (i.e., 45° from the magnetization direction of the memory layer before writing), the magnetization of the memory layer assumes a state in which it is most hard to reverse (critical state). It is very effective to perform a WER test in this state.

Subsequently, data is read from the magnetic memory 13 (step ST4).

Fail bits, in which write data is not identical to read data, are detected by comparing the write and read data (error check). This error check is iterated Nmax times for each of the magnetoresistive effect elements of the magnetic memory 13. Nmax is a natural number not less than 2 (steps ST5 to ST7).

After that, the magnetic memory 13 is evaluated based on the number of times each magnetoresistive effect element of the memory 13 is determined to be a fail bit (step ST8).

For instance, in the evaluation, it is determined whether the number of times each magnetoresistive effect element is determined to be a fail bit is lower than a predetermined value.

Lastly, if the number of times a magnetoresistive effect element is determined to be a fail bit is lower than the predetermined value, this magnetoresistive effect element is determined to be a pass bit. In contrast, if the number of times a magnetoresistive effect element is determined to be a fail bit is equal to or higher than the predetermined value, this magnetoresistive effect element is determined to be a fail bit, and redundancy replacement for replacing the fail bit with a pass bit is performed (step ST9).

Although in the embodiment, the test magnetic field is applied to the magnetic memory 13 in step ST3, it may be applied to the magnetic memory 13 in a step other than step ST3 (e.g., in all steps) as shown in FIG. 18B.

The above-described test method enables the WER test to be performed in a short time of about 24 sec.

[Others]

The above-described test methods are assumed to be performed at room temperature.

However, they can also be performed at a temperature exceeding room temperature. In this case, it is desirable that the test system of FIG. 11 employ a temperature controller that controls the temperature of the magnetic memory 13. The temperature controller may comprise, for example, a heater and a temperature sensor.

For instance, the temperature (test temperature) of the magnetic memory 13 can be set to, for example, 85° C. or 150° C. This will cause decrease in the retention time, increase in read disturb probability, and increase in write error rate.

Thus, control of the test magnetic field and the test temperature can further shorten the required test time, compared to the case where the test is accelerated only using the test magnetic field.

CONCLUSION

As described above, in the embodiment, a test magnetic field of, for example, 100 [Oe] or more can be applied with high uniformity to the magnetic memory. Accordingly, a reliability test can be performed on the magnetic memory (e.g., in the form of a package). Further, by the use of a redundancy technique of replacing fail bits detected in the reliability test with pass bits, magnetic memories can be manufactured with a high yield. As a result, magnetic memories of high quality can be manufactured.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electromagnet comprising:
   a first electromagnet coil having a first portion and a second portion,
   wherein:
   the first portion of the first electromagnet coil includes sub-portions which are parallel with a first plane and which extend in different directions that intersect with each other within the first plane,
   the second portion of the first electromagnet coil includes sub-portions which are parallel with a second plane and which extend in different directions that intersect with each other within the second plane, and
   the first and second planes intersect at a predetermined angle.

2. The electromagnet of claim 1, wherein the predetermined angle is 90°.

3. The electromagnet of claim 1, further comprising:
   a tube-shaped body with a bended ring form,
   wherein the first electromagnet coil is provided in a hollow portion of the tube-shaped body.

4. The electromagnet of claim 3, wherein the tube-shaped body has an electrode of the first electromagnet coil.

5. The electromagnet of claim 3, wherein the tube-shaped body has a cross-sectional surface of one of a square form, a circular form, and a polygonal form.

6. The electromagnet of claim 3, wherein the tube-shaped body has a flat bottom surface which is parallel with the first plane.

7. The electromagnet of claim 1, further comprising:
   a second electromagnet coil having a third portion and a fourth portion and being independent of the first electromagnet coil,
   wherein:
   the third portion of the second electromagnet coil extends in a direction in parallel with a third plane,
   the fourth portion of the second electromagnet coil extends in a direction in parallel with a fourth plane,
   the third and fourth planes intersect at the predetermined angle, and
   the second and fourth planes face each other.

8. The electromagnet of claim 7, wherein the second and fourth planes are parallel with each other.

9. An electromagnet comprising:
   a first electromagnet having a first portion and a second portion,
   wherein:
   the first portion of the first electromagnet includes sub-portions which are parallel with a first plane and which extend in different directions that intersect with each other within the first plane,
   the second portion of the first electromagnet includes sub-portions which are parallel with a second plane and which extend in different directions that intersect with each other within the second plane, and
   the first and second planes intersect at a predetermined angle.

10. The electromagnet of claim 9, wherein the predetermined angle is 90°.

11. The electromagnet of claim 9, wherein:
    the first electromagnet includes a first electromagnet coil and a tube-shaped body with a bended ring form, and
    the first electromagnet coil is provided in a hollow portion of the tube-shaped body.

12. The electromagnet of claim 11, wherein the tube-shaped body has an electrode of the first electromagnet coil.

13. The electromagnet of claim 11, wherein the tube-shaped body has a cross-sectional surface of one of a square form, a circular form, and a polygonal form.

14. The electromagnet of claim 11, wherein the tube-shaped body has a flat bottom surface which is parallel with the first plane.

15. The electromagnet of claim 9, further comprising:
    a second electromagnet having a third portion and a fourth portion and being independent of the first electromagnet,
    wherein:
    the third portion of the second electromagnet extends in a direction in parallel with a third plane,
    the fourth portion of the second electromagnet extends in a direction in parallel with a fourth plane,
    the third and fourth planes intersect at the predetermined angle, and
    the second and fourth planes face each other.

16. The electromagnet of claim 15, wherein the second and fourth planes are parallel with each other.

* * * * *